(12) United States Patent
Brandt

(10) Patent No.: US 6,255,885 B1
(45) Date of Patent: Jul. 3, 2001

(54) LOW VOLTAGE TRANSISTOR BIASING

(76) Inventor: Per-Olof Brandt, Trollebergs gard, S-245 61 Staffanstorp (SE)

( * ) Notice: Subject to any disclaimer, the term of this patent is extended or adjusted under 35 U.S.C. 154(b) by 0 days.

(21) Appl. No.: 09/217,226

(22) Filed: Dec. 21, 1998

(30) Foreign Application Priority Data

Dec. 22, 1997 (GB) .................................................. 9726984

(51) Int. Cl.⁷ .................................................. H03K 5/08
(52) U.S. Cl. ........................................... 327/309; 327/427
(58) Field of Search .................................... 227/309, 321, 227/327, 328, 427, 430, 431, 434, 435; 333/32; 330/277, 289, 296

(56) References Cited

U.S. PATENT DOCUMENTS

| | | | | |
|---|---|---|---|---|
| 3,655,996 | * | 4/1972 | Takahashi | 327/430 |
| 5,363,058 | * | 11/1994 | Sasaki | 330/277 |
| 5,438,298 | * | 8/1995 | Hori | 330/289 |
| 5,506,544 | | 4/1996 | Staudinger et al. | 330/277 |
| 5,724,004 | * | 3/1998 | Reif et al. | 330/277 |

FOREIGN PATENT DOCUMENTS

| | | |
|---|---|---|
| 3920871 A1 | 8/1990 | (DE) . |
| 0033 198 A1 | 8/1981 | (EP) . |
| 0472340 A1 | 2/1992 | (EP) . |
| 0473 299 A2 | 3/1992 | (EP) . |
| 0691742 A2 | 1/1996 | (EP) . |
| 0734 118 A1 | 9/1996 | (EP) . |
| 55-109007 | 8/1980 | (JP) . |
| 60-4866 | 1/1985 | (JP) . |
| 62-114325 | 5/1987 | (JP) . |
| 3-49403 | 3/1991 | (JP) . |
| 61-296804 | 12/1996 | (JP) . |
| WO 90/14712 | 11/1990 | (WO) . |
| WO 91/16764 | 10/1991 | (WO) . |

OTHER PUBLICATIONS

Blaas, D–L; PCT International Search Report; May 5, 1999; pp. 1–3; In re: International Application No. PCT/EP98/08303.

* cited by examiner

*Primary Examiner*—Toan Tran

(57) ABSTRACT

A field effect transistor circuit comprises a field effect transistor (1) having drain (D) and source (S) terminals for connection to respective power supply (Vss, 4) rails and a gate terminal (G) for receiving an input signal. The circuit further comprises a diode (6) which has its anode (B) connected to the gate terminal (G) of the transistor (1) and its cathode for connection to a bias voltage source (7), Vb. The diode (6) is arranged such that when the circuit is in use, the voltage level of the gate terminal (G) of the field effect transistor (1) is maintained at or below a predetermined value.

13 Claims, 4 Drawing Sheets

LOW VOLTAGE TRANSISTOR BIASING

The present invention relates to low voltage transistor biasing, for example for use in a power amplifier.

DESCRIPTION OF THE RELATED ART

Field effect transistors (FETs) in power amplifiers can be used to control the gain of the amplifier by adjusting the gate-source voltage ($V_{GS}$) of the transistor. In some cases, for example, MESFET transistors, it is necessary to bias the gate of the transistor with a negative voltage. However, since the negative bias voltage has to be generated from a limited common positive supply voltage, like a battery, negative voltages of high magnitude are difficult to generate.

In some applications, for example, in radio telephones, it is necessary to be able to turn the transistor completely off so as to guarantee that very little radio frequency energy is transmitted when the phone is not supposed to transmit.

This can be accomplished by biasing the gate of the transistor to a DC level which ensures that the voltage at the gate never reaches above the turn-on voltage of the transistor.

The DC bias voltage determines how much of the AC signal is amplified, which therefore determines the gain of the amplifier in a large signal situation, such as a power amplifier. Thus, a large negative bias voltage will ensure that the transistor remaining in an off state. For example, for an input AC signal of ±1.5 V, and the turn-on voltage of the transistor being −1.5 V, the DC bias voltage would need to be −3 V or lower.

To achieve a DC bias voltage of −3 V from a common supply voltage of +3 V, previously used amplifiers have used a DC/DC converter. The most simple DC/DC converters (charge pumps) include a capacitor and a switch to produce a negative voltage. The switch gives some loss and a reasonable converted negative supply voltage which can be expected is thus −2.5 V. One way to improve this is to add another capacitor which is fed by the generated negative supply as ground, which gives a reasonable negative supply of −5 V. However, the extra components add cost, consume space, and are hard to integrate, since the capacitors have to be fairly large.

SUMMARY OF THE INVENTION

According to one aspect of the present invention, there is provided a field effect transistor circuit comprising a field effect transistor having drain and source terminals for connection to respective power supply rails and a gate terminal for receiving an input signal, the circuit further comprising a diode, having its anode connected to the gate terminal of the transistor and its cathode for connection to a bias voltage source, wherein the diode is arranged such that when the circuit is in use, the voltage level of the gate terminal of the field effect transistor is maintained at or below a predetermined value.

According to a second aspect of the present invention, there is provided a method of biasing a field effect transistor having drain and source terminals for connection to respective power supply rails and a gate terminal for receiving an input signal, the method comprising:

arranging a diode such that its anode is connected to the gate terminal of the transistor and its cathode is connected to a bias voltage source, the diode being arranged such that when the circuit is in use, the voltage level of the gate terminal of the field effect transistor is maintained at or below a predetermined value.

In a preferred embodiment, this allows the transistor to be readily turned off, using the available supply voltage, without requiring as many additional components as in the prior art circuits.

DESCRIPTION OF THE PREFERRED EMBODIMENTS

Figure 1:
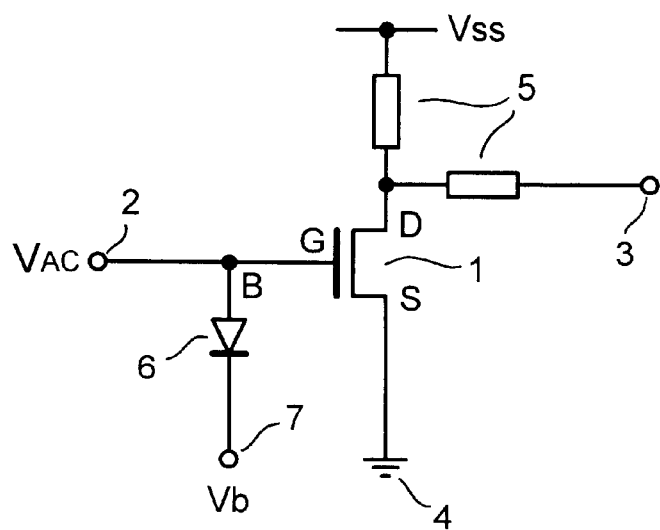
FIG. 1 shows a circuit diagram of a transistor circuit embodying the present invention.

FIG. 1 shows a circuit diagram of a first embodiment of the present invention. A field effect transistor (FET) 1, having gate (G), drain (D) and source (S) terminals is connected between a supply voltage (VSS) (drain D) and ground 4 (source S). The circuit has an AC signal input 2, and a signal output 3. Output impedance 5 is provided at the drain terminal D. The circuit of the present invention is of particular use when it is necessary to bias the gate of the transistor 1 with a negative gate-source voltage, for example when the transistor is a metal-semiconductor FET (MESFET).

In order to bias the gate terminal G of the transistor 1, a diode 6 is connected between the gate G and a bias voltage terminal 7 ($V_b$)

When the diode 6 is conducting the maximum voltage at point B of the circuit equals $V_b + V_t$, where $V_t$ is the threshold voltage of the diode (for example 0.7 V). The maximum voltage at the gate G of the transistor is thus limited to $V_b + V_t$ V.

Figure 2:
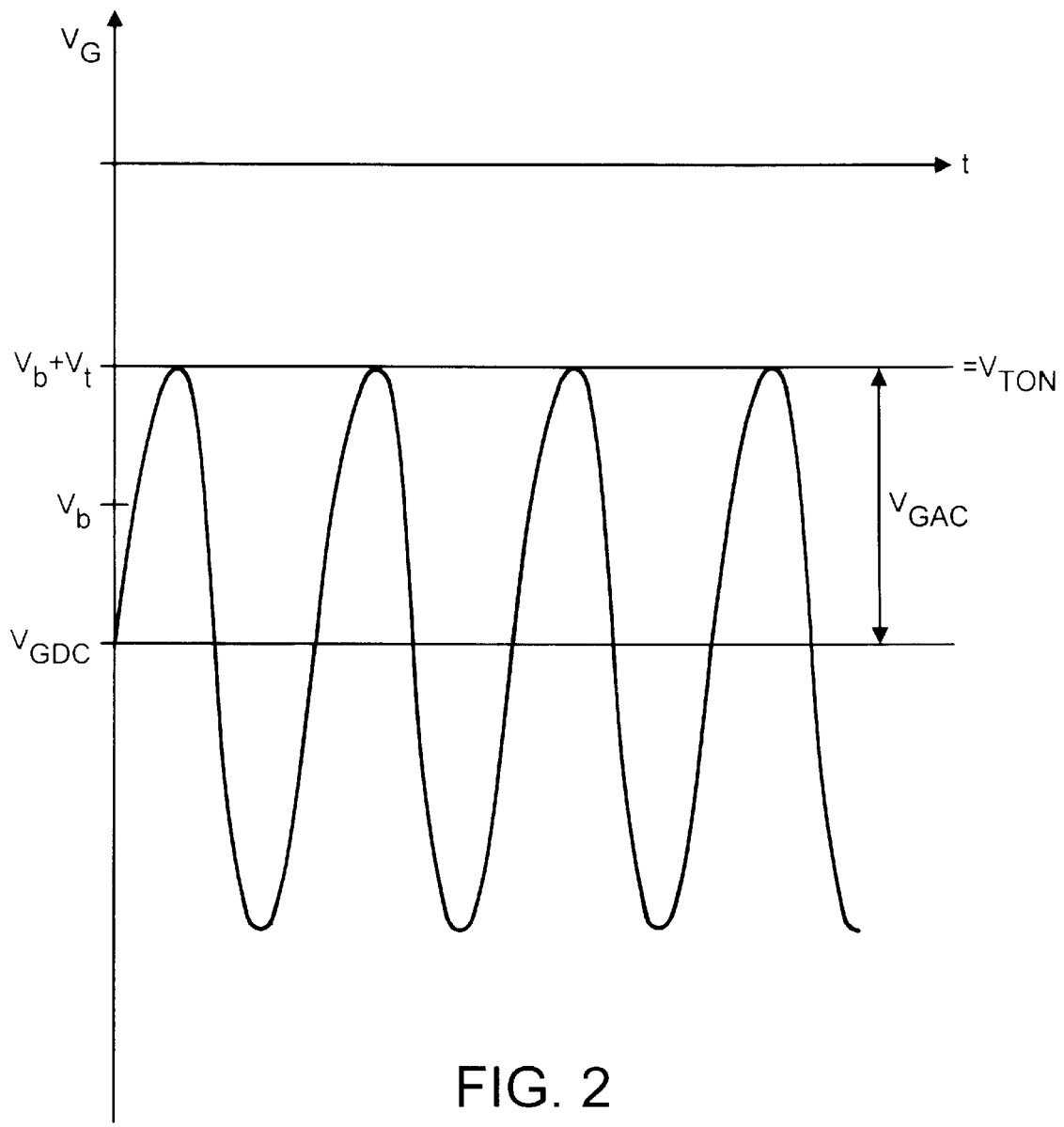
FIG. 2 is a graph illustrating the voltage at the gate of the transistor of FIG. 1.

The maximum peak voltage of the DC biased AC signal at the gate G is therefore limited to this maximum voltage level, as illustrated in FIG. 2. Consequently, the AC signal floats to find its own mean level such that the peak level $V_b + V_t$ does not exceed the maximum allowed level.

Therefore, if the gate voltage $V_G$ is to be maintained at a level which ensures that the transistor remains OFF, the maximum voltage ($V_G$) must be below the turn-on voltage ($V_{TON}$) of the transistor:

$$V_G \leq V_{TON} \qquad \text{(Eq. 1)}$$

Thus, $$V_b + V_t \leq V_{TON} \qquad \text{(Eq. 2)}$$

At the limit of the transistor switching ON, $$V_b + V_t = V_{TON} \qquad \text{(Eq. 3)}$$

For example, for a diode having a threshold voltage of 0.7 V, and a transistor having a turn-on voltage of −1.5 V, the external bias voltage ($V_b$) must be −2.2 V or lower. This level is readily achieved by a simple DC/DC converter, in contrast to the prior art devices which required an external voltage of −3 V.

The gate voltage can be represented as a DC signal which has the input AC component superimposed on it:

$$V_G = V_{GDC} + V_{AC} \quad \text{(Eq. 4)}$$

Therefore the DC bias voltage level ($V_{GDC}$) for the gate voltage is set by the external bias voltage $V_b$, the diode threshold voltage $V_t$ and the AC signal peak voltage $V_{AC}$, according to the following relationship, which is clear from FIG. 2:

$$V_{GDC} = V_b + V_t - V_{AC} \quad \text{(Eq. 5)}$$

Thus it can be seen that for a transistor having a turn on voltage ($V_{TON}$) of −1.5 V, expecting an AC signal input having a peak voltage ($V_{AC}$) of 1.5 V, and having the diode threshold voltage and external voltage as before (0.7 V and −2.2V respectively), a DC bias voltage ($V_{DC}$) of −3 V is produced. This is in line with the requirement that was described previously in order to prevent the transistor being turned on.

However, if the AC peak voltage swing is small, the circuit of FIG. 1 will not successfully bias the transistor because the diode 6 will not turn on. In order to overcome this problem, an impedance transformation circuit can be used.

Figure 3:
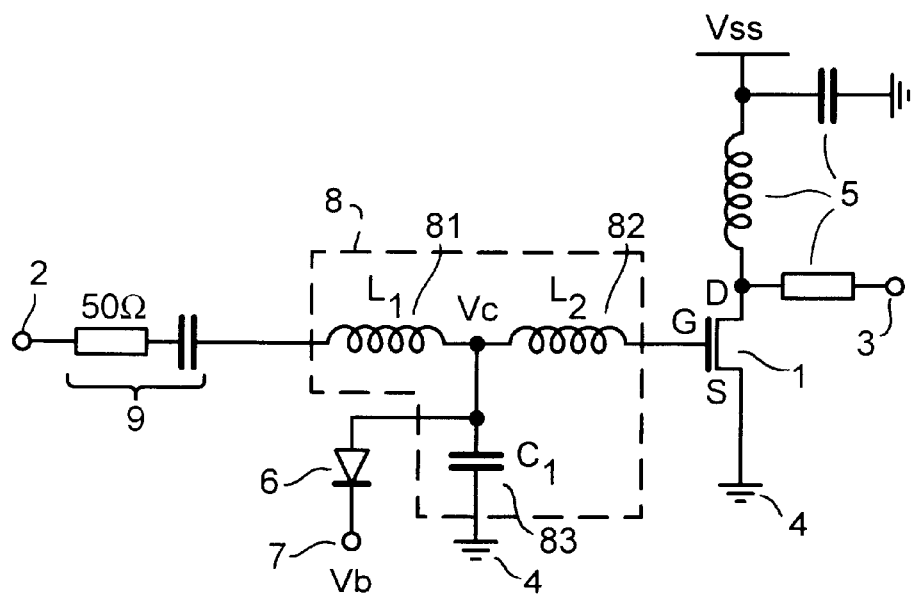
FIG. 3 is a circuit diagram of a second transistor circuit embodying the present invention.

One circuit embodying the present invention in which such a transformation is made is shown in FIG. 3. A three pole low pass filter 8 is provided by two inductors 81 and 82, and a capacitor 83. The AC input signal is supplied at the input terminal 2, through an input impedance 9. As an example, an input signal of 7 dBm and an input impedance of 50 Ω will give an AC voltage signal of 0.7 V peak to peak.

Figure 4:
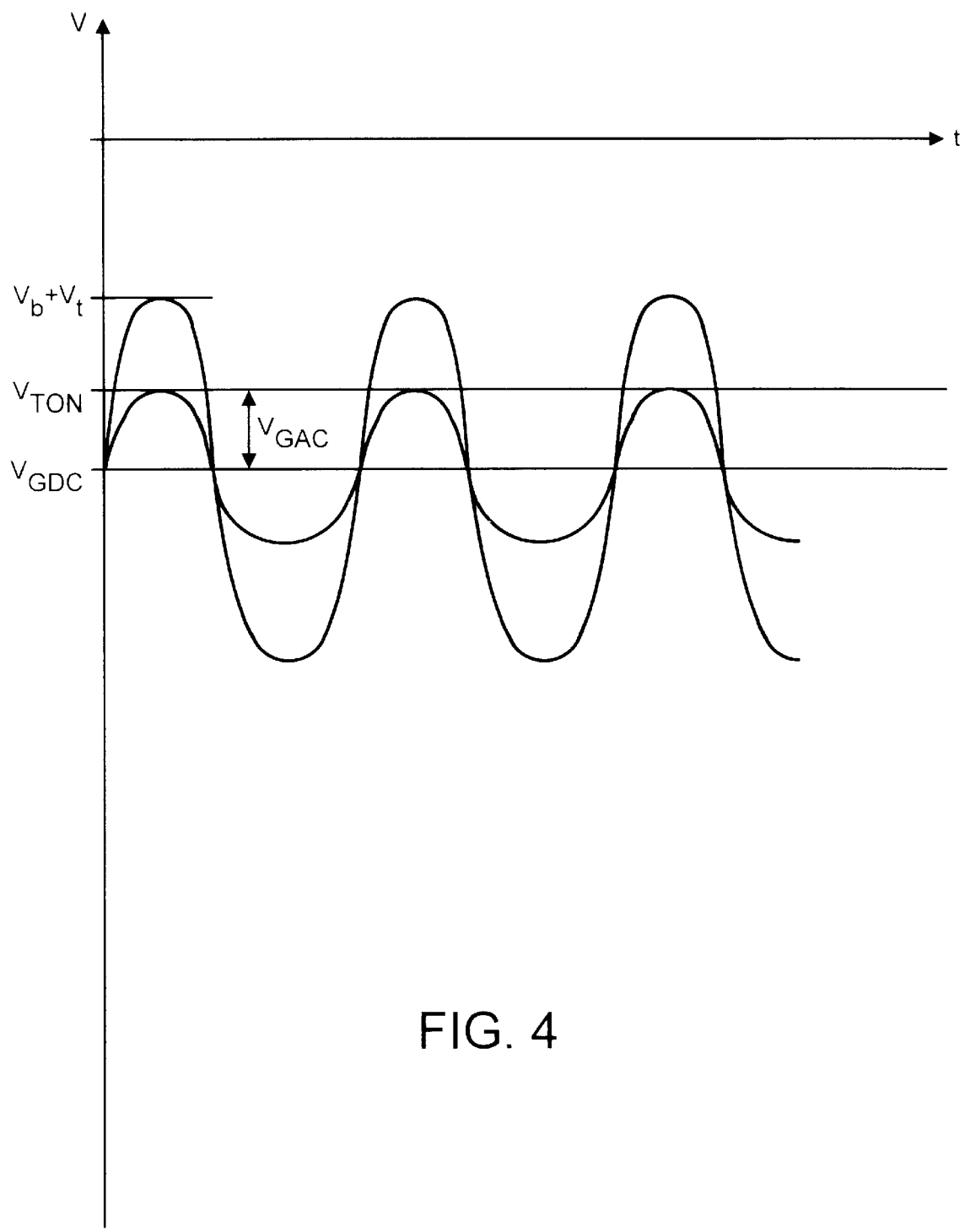
FIG. 4 is a graph illustrating voltage levels produced in the circuit of FIG. 3.

The low pass filter components serve to produce a larger voltage swing ($V_c$) across the capacitor than is input to the filter 8 or output therefrom. For example, if the impedance (achieved by the inductor and capacitor) at the capacitor 83 is 200 ohms, then a 7 dBm signal will give an AC voltage swing of 1.4 V peak to peak across the capacitor 83. Thus, the voltage across the diode 6 is large enough to turn the diode ON, even though the input AC signal has a low peak level. The voltage levels at various points of the circuit of FIG. 3 are illustrated in FIG. 4.

The components 81, 82, and 83 are chosen in dependence upon the level of input AC signal level that can be expected. The values are chosen so that the voltage swing is of sufficient size to turn on the diode 6, for a given input power.

Figure 5:
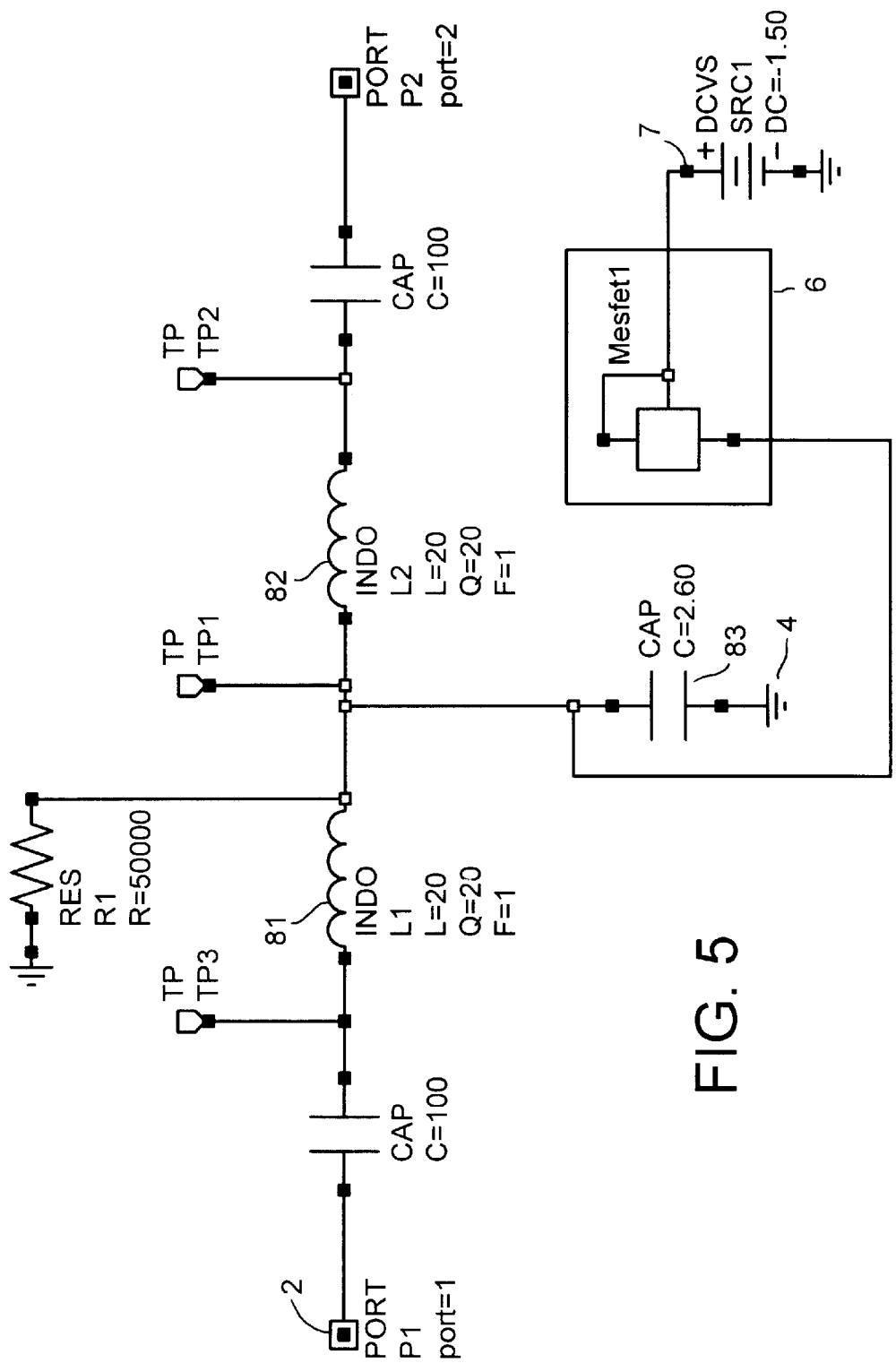
FIG. 5 shows results from a typical simulation of a circuit embodying the present invention.

For example, for a 900 MHz input signal, inductors 81 and 82 may be 20 nH each, and capacitor 83 may be 2.6 pF, for a gate voltage $V_{AC}$ of 0.7V peak (=7 dBm), and a transistor turn on voltage of −1.5V. In general, conventional circuit simulations packages can be used to choose the values of the components. FIG. 5 shows a typical output from a circuit simulation package.

The DC bias required at the gate G of the transistor is determined by the peak level of the AC component of the gate voltage. In order for the transistor to remain off:

$$V_{GAC} + V_{GDC} \leq V_{TON} \quad \text{(Eq. 6)}$$

where $V_{GAC}$ is the AC component peak voltage, $V_{GDC}$ is the DC bias level, and $V_{TON}$ is the turn on voltage of the transistor.

The external bias voltage $V_b$ is then determined from equation 5 above, with $V_{AC}$ being the converted voltage signal $V_C$ across the capacitor 83.

For example, for $V_C$ of 1.4 V, $V_{GAC}$ of 0.7 V peak (1.4 V peak to peak), a diode threshold voltage of 0.7 V, and a transistor turn on voltage of −1.5 V, the desired DC bias level at the gate is −2.2 V ($V_{TON} - V_{GAC}$) This means that the external bias voltage $V_b$ must be less than −1.5 V.

This magnitude of negative voltage is significantly less than the previously required level, and is thus more easily produced.

The diode 6 can be positioned anywhere along the input line, between the input line and the bias voltage Vb, but is most effective where the voltage swing is largest.

It will be appreciated that embodiments of the present invention allow a smaller magnitude negative bias voltage ($V_b$) to be used. Such a voltage is relatively simple to generate.

What is claimed is:

1. A field effect transistor circuit comprising a field effect transistor having drain and source terminals for connection to respective power supply rails and a gate terminal for receiving an input signal, the circuit further comprising a diode, having its anode connected to the gate terminal of the transistor and its cathode for connection to a bias voltage source, wherein the diode is arranged such that when the circuit is in use, the voltage level of the gate terminal of the field effect transistor is maintained at or below a predetermined value, the circuit further comprising an impedance transformation circuit connected to the transistor, the diode and an input terminal of the circuit, wherein the impedance transformation circuit comprises first and second inductive elements connected in series between the input of the transistor circuit and the gate terminal of the transistor, and a capacitor connected between ground and a common connection between the first and second inductive elements, the diode being connected to the gate terminal of the transistor via the second inductive element.

2. A circuit as claimed in claim 1, wherein the bias voltage source is negative.

3. A circuit as claimed in claim 1, wherein the anode of the diode is connected directly to the gate terminal of the field effect transistor.

4. A circuit as claimed in claim 1, wherein the transistor is a metal-semiconductor field effect transistor (MESFET).

5. A power amplifier including a field effect transistor circuit as claimed in claim 1.

6. A method of biasing a field effect transistor having drain and source terminals for connection to respective power supply rails and a gate terminal for receiving an input signal, the method comprising:

arranging a diode such that its anode is connected to the gate terminal of the transistor and its cathode is connected to a bias voltage source, the diode being arranged such that when the circuit is in use, the voltage level of the gate terminal of the field effect transistor is maintained at or below a predetermined value; and arranging an impedance transformation circuit to be connected to the transistor, the diode and an input terminal of the circuit, wherein the impedance transformation circuit comprises first and second inductive elements connected in series between the input of the transistor circuit and the gate terminal of the transistor, and a capacitor connected between ground and the common connection between the first and second inductive elements, the diode being connected to the gate terminal of the transistor via the second inductive element.

7. A method as claimed in claim 6, wherein the bias voltage source is negative.

8. A method as claimed in claim 6, wherein the anode of the diode is connected directly to the gate terminal of the field effect transistor.

9. A method as claimed in claim 6, wherein the transistor is a metal-semiconductor field effect transistor (MESFET).

10. A radio frequency power amplifier including a field effect transistor circuit comprising a field effect transistor having drain (D) and source (S) terminals for connection to respective power supply rails and a gate terminal (G) for receiving an input signal, a diode having its anode connected via an impedance transformation circuit to the gate terminal (G) of the transistor and its cathode for connection to a negative bias voltage source, the impedance transformation circuit further being connected to an input terminal of the field effect transistor circuit, wherein the diode is arranged such that when the field effect transistor circuit is in use, the voltage level of the gate terminal of the field effect transistor is maintained at or below a predetermined value, wherein the impedance transformation circuit comprises first and second inductive elements connected in series between the input of the transistor circuit and the gate terminal (G) of the transistor, and a capacitor connected between ground and the common connection between the first and second inductive elements, the diode being connected to the gate terminal (G) of the transistor via the second inductive element.

11. A circuit according to claim 10, wherein the transistor is a metal-semiconductor field effect transistor (MESFET).

12. A radio frequency power amplifier including a field effect transistor circuit comprising a field effect transistor having drain (D) and source (S) terminals for connection to respective power supply rails and a gate terminal (G) for receiving an input signal, a diode having its anode connected via an impedance transformation circuit to the gate terminal (G) of the transistor and its cathode for connection to a bias voltage source, the impedance transformation circuit further being connected to an input terminal of the field effect transistor circuit, wherein the diode is arranged such that when the field effect transistor circuit is in use, the voltage level of the gate terminal of the field effect transistor is maintained at or below a predetermined value, wherein the impedance transformation circuit comprises first and second inductive elements connected in series between the input of the transistor circuit and the gate terminal (G) of the transistor, and a capacitor connected between ground and the common connection between the first and second inductive elements, the diode being connected to the gate terminal (G) of the transistor via the second inductive element.

13. A circuit according to claim 12, wherein the transistor is a metal-semiconductor field effect transistor (MESFET).

* * * * *